(12) United States Patent
Fukuyama et al.

(10) Patent No.: US 7,287,915 B2
(45) Date of Patent: Oct. 30, 2007

(54) OPTICAL DEVICE

(75) Inventors: Masashi Fukuyama, Inuyama (JP); Yasunori Iwasaki, Nishikasugai-Gun (JP); Akiyoshi Ide, Kasugai (JP); Takuhiro Tani, Kani (JP)

(73) Assignee: NGK Insulators, Ltd., Nagoya City (JP)

( * ) Notice: Subject to any disclaimer, the term of this patent is extended or adjusted under 35 U.S.C. 154(b) by 0 days.

(21) Appl. No.: 11/187,713

(22) Filed: Jul. 22, 2005

(65) Prior Publication Data

US 2005/0259912 A1    Nov. 24, 2005

Related U.S. Application Data

(63) Continuation of application No. PCT/JP03/16347, filed on Dec. 19, 2003.

(30) Foreign Application Priority Data

Jan. 27, 2003    (JP)    ............... 2003-017942

(51) Int. Cl.
  *G02B 6/36* (2006.01)
  *G02B 6/30* (2006.01)
(52) U.S. Cl. ............... 385/89; 385/49; 385/88
(58) Field of Classification Search ............... 385/14, 385/49, 88, 89, 91, 92, 94
  See application file for complete search history.

(56) References Cited

U.S. PATENT DOCUMENTS

| | | | |
|---|---|---|---|
| 4,186,996 A * | 2/1980 | Bowen et al. | 385/92 |
| 4,820,013 A | 4/1989 | Fuse | 385/120 |
| 4,846,543 A | 7/1989 | Kapany et al. | 385/46 |
| 4,989,338 A | 2/1991 | Tsuji et al. | 33/554 |
| 5,499,309 A | 3/1996 | Kozuka et al. | 385/38 |
| 5,940,550 A | 8/1999 | Plickert et al. | 385/15 |
| 6,019,523 A * | 2/2000 | Honmou | 385/94 |
| 6,027,253 A | 2/2000 | Ota et al. | 385/83 |
| 6,048,107 A | 4/2000 | Pubanz | 385/92 |
| 6,132,107 A | 10/2000 | Morikawa | 385/89 |
| 6,250,820 B1 | 6/2001 | Melchior et al. | 385/89 |
| 6,257,772 B1 | 7/2001 | Nakanishi et al. | 385/89 |
| 6,318,908 B1 * | 11/2001 | Nakanishi et al. | 385/89 |
| 6,327,407 B1 | 12/2001 | Mitsuda et al. | 385/49 |
| 6,406,196 B1 | 6/2002 | Uno et al. | 385/89 |
| 6,491,447 B2 | 12/2002 | Aihara | 385/92 |
| 6,507,680 B1 | 1/2003 | Nishimura et al. | 385/14 |
| 6,516,104 B1 | 2/2003 | Furuyama | 385/14 |
| 6,526,204 B1 | 2/2003 | Sherrer et al. | 385/49 |

(Continued)

FOREIGN PATENT DOCUMENTS

EP    1 312 960 A1    5/2003

(Continued)

*Primary Examiner*—Tina M Wong
(74) *Attorney, Agent, or Firm*—Burr & Brown (57) ABSTRACT

An optical device comprises an optical head and a package containing the optical head and having pins led outside. A V-groove is formed in one side of a glass substrate. On the other side, the glass substrate is secured to the base of the package. A PD array and the pins are electrically interconnected through a gold electrode pattern formed on a mounting face of a submount, through holes, electrode pads formed on the top of the submount, and wires.

9 Claims, 7 Drawing Sheets

U.S. PATENT DOCUMENTS

| | | | |
|---|---|---|---|
| 6,542,691 B2 | 4/2003 | Mizuno et al. | 385/146 |
| 6,733,190 B2 * | 5/2004 | Kuhara et al. | 385/94 |
| 6,793,410 B2 * | 9/2004 | Nakanishi et al. | 385/92 |
| 6,813,418 B1 | 11/2004 | Kragl | 385/49 |
| 7,123,798 B2 * | 10/2006 | Fukuyama et al. | 385/49 |
| 7,174,062 B2 * | 2/2007 | Fukuyama et al. | 385/14 |
| 2002/0037138 A1 | 3/2002 | Kaneko et al. | 385/49 |
| 2003/0095756 A1 | 5/2003 | Tohgoh et al. | 385/88 |
| 2005/0041907 A1 | 2/2005 | Fukuyama et al. | 385/14 |

FOREIGN PATENT DOCUMENTS

| | | |
|---|---|---|
| JP | 50-100467 | 8/1975 |
| JP | 61-184938 | 8/1986 |
| JP | 63-191111 A1 | 8/1988 |
| JP | 64-042610 A1 | 2/1989 |
| JP | 02-015203 A1 | 1/1990 |
| JP | 02-030181 A1 | 1/1990 |
| JP | 02-096609 A1 | 4/1990 |
| JP | 03-078711 | 4/1991 |
| JP | 03-103804 A1 | 4/1991 |
| JP | 07-030131 A1 | 1/1995 |
| JP | 07-104146 A1 | 4/1995 |
| JP | 07-159658 A1 | 6/1995 |
| JP | 09-120014 A1 | 5/1997 |
| JP | 09-159882 | 6/1997 |
| JP | 10-104473 | 4/1998 |
| JP | 10-300936 A1 | 11/1998 |
| JP | 11-074496 A1 | 3/1999 |
| JP | 11-133255 A1 | 5/1999 |
| JP | 11-142690 | 5/1999 |
| JP | 2000-249874 A1 | 9/2000 |
| JP | 2000-347050 | 12/2000 |
| JP | 2001-100063 A1 | 4/2001 |
| JP | 2001-264594 A1 | 9/2001 |
| JP | 2002-182051 A1 | 6/2002 |
| JP | 2002-182052 A1 | 6/2002 |
| JP | 2002-231974 A1 | 8/2002 |
| JP | 2002-343983 A1 | 11/2002 |
| JP | 2003-156665 A1 | 5/2003 |
| WO | WO97/06458 A1 | 2/1997 |
| WO | 01/04671 A2 | 1/2001 |

* cited by examiner

OPTICAL DEVICE

CROSS-RELATED TO RELATED APPLICATION

This application is a continuation of International Application No. PCT/JP03/016347 having, an international filing date of Dec. 19, 2003, which designated the United States, the entirety of which is incorporated herein by reference.

BACKGROUND OF THE INVENTION

1. Field of the Invention

The present invention relates to an optical device including an optical fiber array having one or more optical fibers, and more particularly to an optical device suitable for use in monitoring signal light while the light is propagated through an optical fiber.

2. Description of the Related Art

With the recent development of wavelength multiplex communications using fiber amplifiers, it has become customary to monitor the amounts of light at respective wavelengths with photodiodes (PD), in order to adjust the amounts of light, and then amplify them with amplifiers.

Various methods are known for monitoring amounts of light at respective wavelengths. Since the optical fibers need to be coupled to respective monitoring devices, the monitoring devices alone are of considerable size.

Therefore, there has been a demand for smaller highly packed monitoring devices. For monitoring signal light, it is customary for the monitoring device to extract a portion of the signal light. It is desirable for monitoring devices to be able to monitor signal light without significantly attenuating the signal light.

Heretofore, a technique disclosed in Japanese Laid-Open Patent Publication No. 2001-264594, for example, has been proposed in the art. According to the disclosed technique, an optical fiber is placed in a V-shaped groove defined in a glass substrate, and thereafter, a parallel groove is formed in the glass substrate obliquely to an optical axis of the optical fiber. Then, a light reflecting base (optical member) is inserted into the parallel groove, with the gap filled with an ultraviolet-curable resin (adhesive).

From the signal light that is propagated through the optical fiber, a light component (reflected light) thereof, which is reflected by the light reflecting base, is extracted out of the cladding of the optical fiber. The signal light can be monitored by detecting the reflected light using a photodetector (PD), for example.

If PDs are disposed on the optical fibers, then since most of the optical fibers used are made up from single-core optical fibers, PDs in metal packages are often employed (see, for example, Japanese Laid-Open Patent Publication No. 10-300936, Japanese Laid-Open Patent Publication No. 11-133255, and PCT International Patent Publication No. WO97/06458). This is because single-core optical fibers pose less space limitations, and several PDs in metal packages are already available on the market and have proven satisfactory as to cost and reliability.

However, it is difficult to use PDs in metal packages in combination with multiple-core optical fibers. In particular, if optical fibers are required to be installed at a high density, e.g., at a pitch of 250 µm, then it is necessary to employ a photodiode array (PD array) comprising a plurality of bare photodiodes.

Generally, electric signals from a PD array are output through a package having a plurality of pins.

According to major conventional structures, electrodes are mounted on an upper surface of a V-groove substrate to which an optical fiber array is fixed, or on an upper surface of an optical waveguide that is optically coupled to such a V-groove substrate, and interconnections are connected to a package or the like through the electrodes (see, for example, Japanese Laid-Open Patent Publication No. 7-104146, Japanese Laid-Open Patent Publication No. 2-15203, PCT International Publication No. WO97/06458, and Japanese Laid-Open Patent Publication No. 7-159658).

One common problem is that, since the electrodes are mounted on the upper surface of the V-groove substrate or on the upper surface of the optical waveguide, there are limitations imposed on the interconnections connected (wire bonding) to the PD array, the mounted configuration of the PD array, etc.

In view of the interconnections connected to the package, e.g., wire bonding to the pins of the package, since the wires cannot be too long, the interconnections on the upper surface of the V-groove substrate or on the upper surface of the optical waveguide need to be positioned closely to the pins. This means that the V-groove substrate or the optical waveguide itself needs to be positioned closely to the pins, and the V-groove substrate or the optical waveguide thereby has its width unduly increased. As a result, the cost for such devices is increased.

In addition, it is necessary that the electrodes be formed in relative positional alignment with the V-groove substrate or the optical waveguide. However, a tedious and time-consuming procedure is required to form the electrodes in such a manner.

Furthermore, because the electrodes are mounted on the V-groove substrate after V-shaped grooves are formed therein, or the electrodes are mounted on a completed optical waveguide substrate of the optical waveguide, if the electrodes are defective, then the V-groove substrate or the optical waveguide substrate also becomes defective, resulting in a reduction in yield.

One problem inherent in V-groove substrates, particularly V-groove substrates of glass, is that their surfaces are often ground and do not have a mirror finish. Highly packed interconnections on such rough surfaces are unfavorable from the viewpoints of characteristics and reliability. The surface of a V-groove surface is ground before V-shaped grooves are formed therein because of the need for parallelism between a cutting machine for forming the V-shaped grooves and the machined surface of the substrate. After the surface of the substrate is ground by a surface grinding machine or the like, it is machined to form V-shape grooves therein.

Many conventional arrangements have been disclosed in which, rather than electrodes disposed on the surface of a V-groove substrate or an optical waveguide, the PD array itself is disposed on optical fibers (see, for example, PCT International Publication No. WO97/06458, Japanese Laid-Open Patent Publication No. 63-191111, Japanese Laid-Open Patent Publication No. 2000-249874, and Japanese Laid-Open Patent Publication No. 3-103804). Most of these publications, directed to such conventional arrangements, disclose nothing about interconnections to be connected after the installation of the PD array. Generally, interconnections may be connected to the package via another wiring board disposed between the PD array and the optical fiber array, or by direct wire bonding from the PD array.

Connecting interconnections via another wiring board is troublesome in that the other wiring board must be newly installed (positioned and bonded), after the PD array has been installed, and then the interconnections thereto are connected. Direct wire bonding from the PD array requires considerably long bonding wires, and is not sufficiently reliable. Further, it is highly difficult to perform direct wire bonding because complex interconnections must be directly connected from the PD array, which comprises highly packed photodiodes.

For positioning the PD array, it is the general practice to align the PD array while output currents therefrom are confirmed. According to both of the above processes, since a probe is directly applied to the PD array at this stage, this complicates the positioning process, making it a highly difficult task to perform.

A process involving the connection of interconnections to a PD array is disclosed in Japanese Laid-Open Patent Publication No. 2002-182051, for example. According to the disclosed process, a PD array has a portion installed on a submount and another portion (active layer portion) positioned within an optical path of reflected light, with an adhesive interposed therebetween. That is, a portion of the PD array other than the active layer is installed on the submount, because any obstructions positioned within the optical path leading to the active layer portion of the PD array tend to prevent the assembly from functioning properly as a monitor.

However, in the above structure, when stresses are generated by shrinkage of the adhesive as it is cured, or when dimensional changes thereof occur as it is thermally expanded, the PD array suffers strain stresses, since the PD array itself possesses a moment fulcrum. When such strain stresses are applied to the PD array, the characteristics of the PD array are adversely affected, by an increase in dark current, etc.

The submount supports the PD array thereon and has interconnections formed on its surface. If the submount experiences warpage, however, then the interconnections thereon may become unreliable, and a dark current may be produced by the PD array. Therefore, to avoid such warpage, the submount needs to have a thickness of at least 0.5 mm. Consequently, the distance between the optical fiber array and the PD array cannot be reduced to less than 0.5 mm, resulting in a loss of reflected light and increased crosstalk. In addition, the required distance between the optical fiber array and the PD array poses limitations on efforts to reduce the size of the entire assembly and increase the monitoring capability thereof.

SUMMARY OF THE INVENTION

It is an object of the present invention to provide an optical device, which allows the photodetector surfaces of light-detecting elements to be positioned closely to the cladding surfaces of optical fibers, for effectively achieving increased photodetector sensitivity and reduced crosstalk, and further, wherein the size of the optical device, including a package thereof, is effectively reduced in size.

Another object of the present invention is to provide an optical device, which allows a wire bonding step to be dispensed with, and which can be manufactured by a simplified process at a reduced cost.

According to the present invention, an optical device is provided, comprising an optical head having a first substrate with V-shaped grooves defined therein, and a package housing the optical head and having pins extending outwardly. One or more optical fibers are fixed in the V-shaped grooves in the first substrate, the optical fibers having a reflecting function. An optical element is fixed by an adhesive layer to an optical path of reflected light, which is generated by at least the reflecting function, outside of claddings of the optical fibers. A second substrate is provided on which the optical element is mounted, the second substrate having a mounting surface on which the optical element is mounted, the mounting surface being disposed in confronting relation to the first substrate, wherein the optical element and the pins of the package are electrically connected to each other by a conductive pattern disposed on the second substrate.

When the second substrate is installed on the first substrate, the optical element can be oriented toward the optical fibers, and can be disposed closely to cladding surfaces of the optical fibers, making it possible to effectively increase photodetector sensitivity and reduce crosstalk.

Since the optical element can be disposed closely to the cladding surfaces of the optical fibers, as described above, the optical head itself can be reduced in size, and the optical device, including the package thereof, can also be reduced in size.

In the above arrangement, the package comprises a base on which the optical head is mounted, wherein the pins are disposed on the base. The first substrate has a surface fixed to the base remotely from the surface thereof in which the V-shaped grooves are defined, wherein the optical element and the pins are electrically connected to each other by the conductive pattern disposed on the second substrate.

Preferably, the conductive pattern disposed on the second substrate extends to a surface remote from the mount surface, the conductive pattern and the pins being electrically connected to each other by wires.

In the above arrangement, the package may have a base on which the optical head is mounted, the pins being disposed on the base. The second substrate has a surface fixed to the base remote from the mounting surface, the optical element and the pins being electrically connected to each other by the conductive pattern disposed on the second substrate.

The conductive pattern may be disposed on the mounting surface of the second substrate, the conductive pattern and the pins being electrically connected to each other by wires. Since the length of the wires is reduced, the wire bonding process therefor can be simplified, and the wires operate with improved reliability.

The conductive pattern disposed on the second substrate may extend to a surface remote from the mount surface, the conductive pattern and the pins being electrically connected directly to each other. In this case, the wire bonding process can be omitted, and the optical device can be manufactured by a simplified process at reduced cost.

The second substrate may double as a base for the package. In this case, the vertical size of the optical device can be reduced significantly, and the optical device can be made even smaller in size.

Preferably, the pins are disposed on the base, the conductive pattern being disposed on the mounting surface of the second substrate while being electrically connected directly to the pins. In this case, the wire bonding process can also be omitted, and the optical device can be manufactured by a simplified process at reduced cost.

According to the present invention, there is also provided an optical device comprising an optical head and a package housing the optical head therein and having external leads. The optical head comprises a first substrate with V-shaped grooves defined therein, with one or more optical fibers fixed in the V-shaped grooves of the first substrate, the optical fibers having a reflecting function. An optical element is fixed by an adhesive layer to an optical path of reflected light, which is generated by at least the reflecting function, outside of claddings of the optical fibers. A second substrate is provided on which the optical element is mounted, the second substrate having a mounting surface on which the optical element is mounted, wherein the mounting surface is disposed in confronting relation to the first substrate and doubles as a base of the package. The optical element and the external leads of the package are electrically connected to each other by a conductive pattern disposed on the second substrate and via holes defined in the second substrate. The optical device thus arranged can be of a smaller size and possess a lower profile.

The above and other objects, features, and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Embodiments, in which an optical device according to the present invention is applied to a 4-channel in-line power monitoring module, for example, shall be described below with reference to FIGS. 1 through 7.

Figure 1:
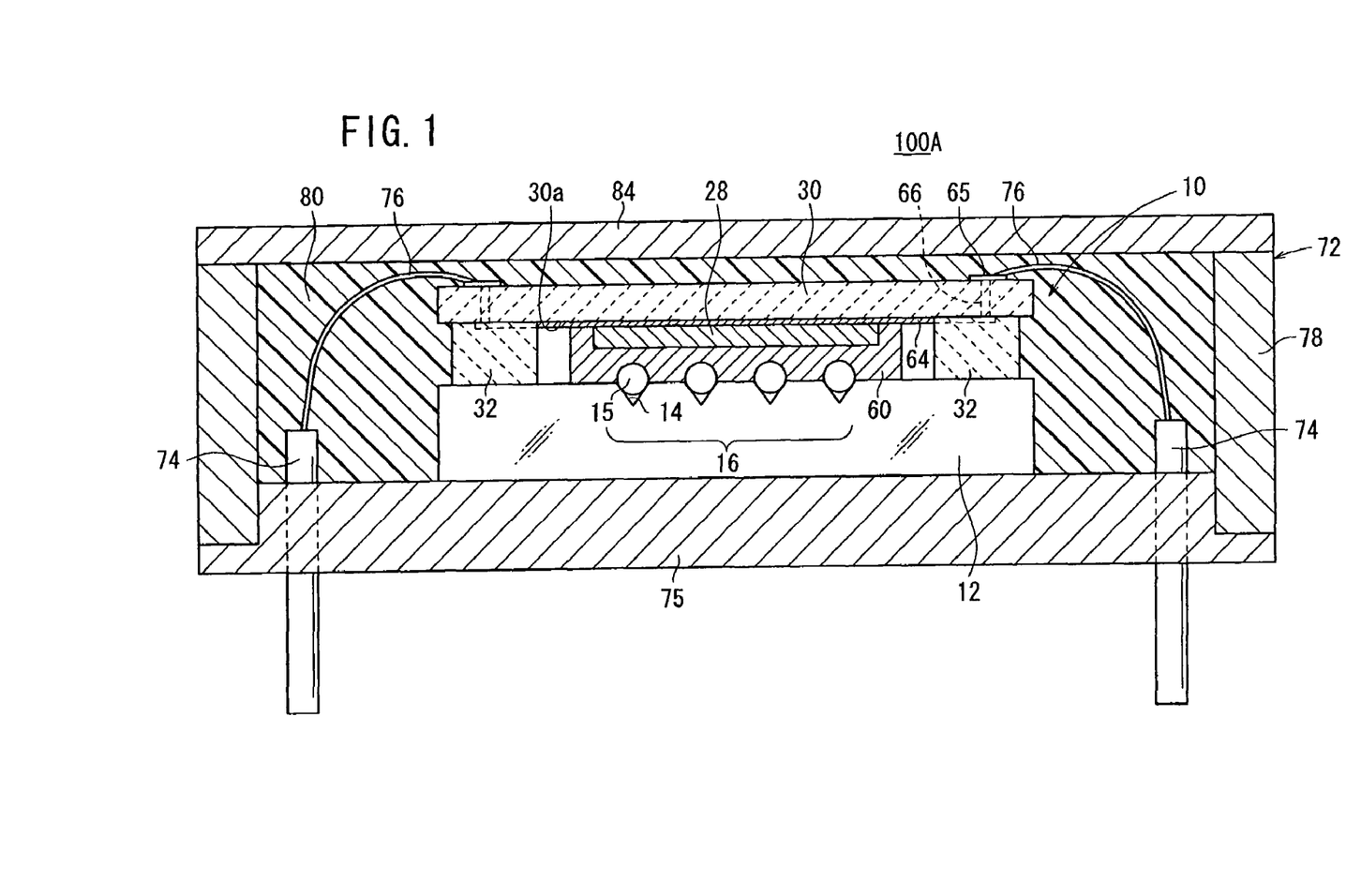
FIG. 1 is a cross-sectional view of an optical device according to a first embodiment of the present invention.

As shown in FIG. 1, an optical device 100A according to a first embodiment of the present invention has an optical head 10, with a package 72 housing the optical head 10 and having pins 74 extending outwardly.

The package 72 has a base 75 on which the optical head 10 is fixedly mounted, a ring 78 disposed around the base 75 in surrounding relation to the optical head 10, and a lid 84 closing an upper opening of the ring 78. The pins 74 are mounted on the base 75. The optical head 10, which is housed in the package 72, is sealed by a resin 80.

Figure 2:
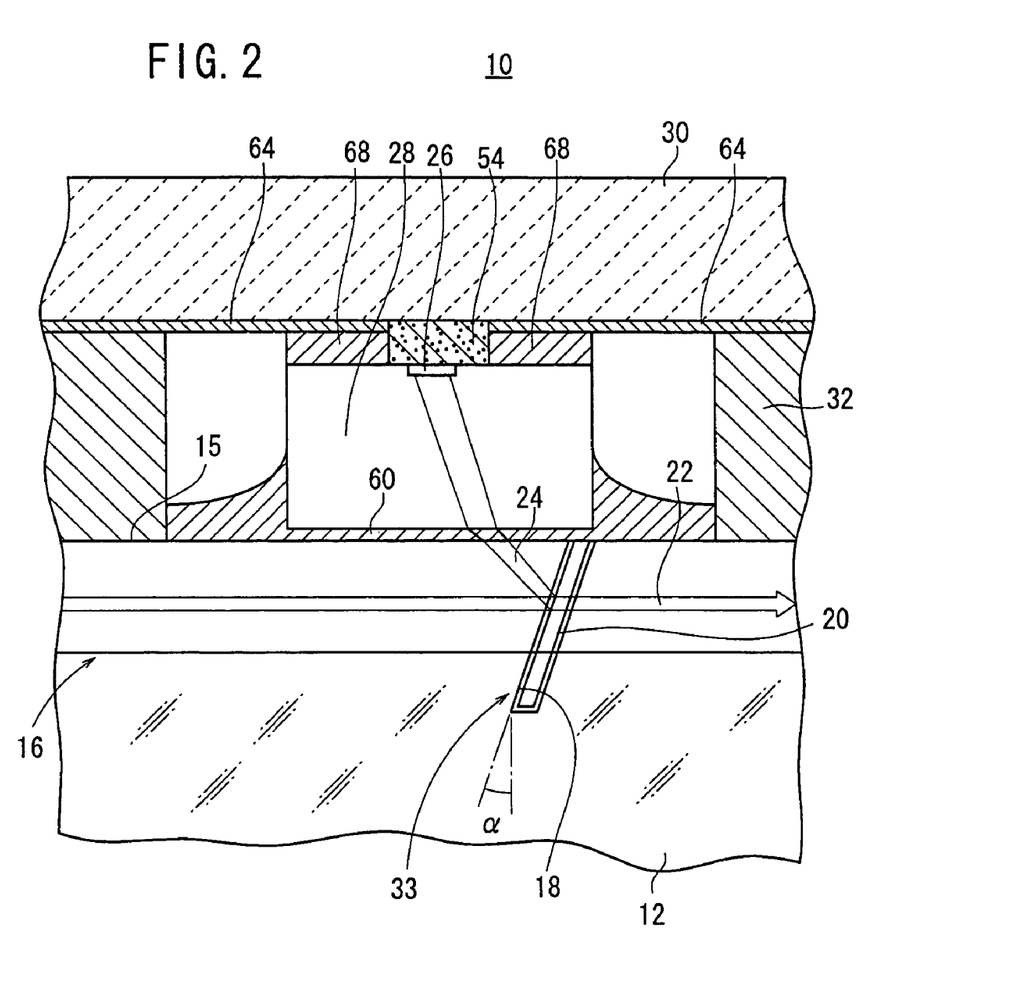
FIG. 2 is a cross-sectional view of an optical head of the optical device according to the first embodiment.

As shown in FIGS. 1 and 2, the optical head 10 comprises a glass substrate 12, and an optical fiber array 16, comprising a plurality of optical fibers 15 fixed in a plurality of V-shaped grooves 14, is defined in the glass substrate 12. A slit 18 (see FIG. 2) extends from respective upper surfaces of the optical fibers 15 into the glass substrate 12 and a dividing member 20 (see FIG. 2) is inserted in the slit 18. A PD (PhotoDiode) array 28 has a plurality of active layers 26 for detecting light (reflected light) 24 reflected by at least the dividing member 20, of signal light 22 passing through the optical fibers 15. A submount 30 fixes the PD array 28 so as to face the optical fiber array 16, and spacers 32 are provided for stably fixing the PD array 28. Two end faces of the slit 18, and face and reverse sides of the dividing member 20, function as a reflector 33 (see FIG. 2) for reflecting part of the light 22 that passes through the optical fibers 15.

That is, the optical head 10 of the optical device 100A according to the present embodiment comprises the glass substrate 12 with the V-shaped grooves 14 defined therein, the optical fiber array 16 fixed in the V-shaped grooves in the glass substrate 12, and members for providing the reflecting function (the slit 18, the dividing member 20, etc.) to each of the optical fibers 15. The optical head 10 further comprises the PD array 28, which is securely mounted by an adhesive layer 60 within an optical path of the reflected light 24 generated by at least the reflecting function, outside of the cladding of each of the optical fibers 15, and the submount 30 on which the PD array 28 is mounted. The submount 30 is disposed such that a mounting surface 30a of the submount 30 faces the glass substrate 12.

In this embodiment, the optical fiber array 16 comprises a plurality of optical fibers 15, and "each of the optical fibers 15" implies "each of the four optical fibers 15". However, since even one optical fiber 15 can make up the optical fiber array 16, "each of the optical fibers" or "a plurality of optical fibers" may also be interpreted as implying "a single optical fiber."

The glass substrate 12 may be made of borosilicate glass, e.g., Pyrex (registered trademark) glass. The angle of the V-shaped grooves 14 defined in the glass substrate 12 should preferably be 45° or greater, in view of the load which will be applied to each of the optical fibers 15 of the optical fiber array 16 when the slits 18 subsequently are formed. The angle should also preferably be 95° or less, for allowing a sufficient amount of adhesive (=bonding strength) to be used, in order to produce a lid-free optical fiber array. According to the first embodiment, a preferred angle of 70° is used.

The optical fiber array 16 is fixed to the glass substrate 12 by placing the optical fiber array 16 in the V-shaped grooves 14, applying an ultraviolet-curable adhesive, and then applying ultraviolet radiation, from a reverse side of the optical fiber array 16 and from above the optical fiber array 16, to cure the adhesive.

The slit 18 has a thickness of 30 μm, a depth of 200 μm, and a tilt angle α of 20° (see FIG. 2). The thickness of the slit 18 should preferably be in the range of from 5 to 50 μm. If the thickness of the slit 18 is smaller than 5 μm, then the member (dividing member 20) that is inserted into the slit 18 is too thin to be mounted with ease. If the thickness of the slit 18 is greater than 50 μm, then optical loss is increased excessively, to the extent that the operating characteristics and actual design specifications cannot be met.

The depth of the slit 18 should preferably be in the range of from 130 μm to 250 μm. If the depth of the slit 18 is smaller than 130 μm, then the slit, when machined, may possibly terminate within the optical fibers 15, causing damage to the optical fibers 15 during machining of the slit. If the depth of the slit 18 is greater than 250 μm, then the strength of the glass substrate 12 may be reduced.

The tilt angle α should preferably be in the range of from 15° to 25°. If the tilt angle α is smaller than 15°, then the crosstalk (interference) characteristics of the PD array 28 may become impaired, as described later. If the tilt angle α is greater than 25°, then the polarization dependency of the reflected light 24 in the dividing member may become impaired.

The dividing member 20 comprises a substrate made of quartz glass. The dividing member 20 may also be made of a plastic material, a high-polymer material, or a polyimide material. However, since the dividing member 20 has a large angle of 20°, the dividing member 20 should preferably be made of a material having the same refractive index as the optical fibers 15 (quartz) themselves, in order to prevent the optical axis of transmitted light from being displaced due to refraction.

A dividing multilayer film is formed on the quartz glass substrate. The quartz substrate is of 50 mm×50 mm×1 mm. The quartz glass substrate is designed to have a tilt angle of 20° and a division ratio represented by a transmittance of 93% and a reflectance of 7%. The multilayer film is formed of $SiO_2$, $TiO_2$, $Al_2O_3$ on the quartz glass substrate by evaporation. The multilayer film is designed to have flat characteristics (reflectance) in a wavelength range of from 1510 nm to 1630 nm. The polarization dependency of the multilayer film is designed so as to be smaller than 0.05 dB on the transmission side, and smaller than 0.1 dB on the reflection side, within the above wavelength range. The quartz glass substrate with the multilayer film formed thereon is machined into a chip having a size of 6 mm×2 mm. The substrate, in the form of such a chip, is polished into a thin plate having a thickness of 25 μm.

The dividing member 20 is inserted into the slit 18, coated with an ultraviolet-curable adhesive, and then irradiated with ultraviolet rays to cure the ultraviolet-curable adhesive.

As shown in FIG. 2, the PD array 28 has a structure for detecting light applied to its reverse side. An anisotropic conductive paste 54, rather than gold solder or electrode or silver paste, is placed on the upper surfaces of the active layers 26 (which face the submount 30). From the standpoint of crosstalk, the region on the upper surfaces of the active layers 26 should preferably be formed from a material having low reflectance, such as the anisotropic conductive paste 54, air, or the like, rather than from a material having high reflectance, such as gold or the like.

The PD array 28 may be a PD array for detecting light applied to a face side thereof.

The photodetector portion (active layers 26) of the PD array 28, having a structure for detecting light applied to its reverse side, has a diameter of about 60 μm. The diameter of the photodetector portion (active layers 26) should preferably be in a range of from 40 to 80 μm. If the diameter of the photodetector portion (active layers 26) is smaller than 40 μm, then since the size of the photodetector portion (active layers 26) is too small, the efficiency with which the PD array 28 detects light (PD efficiency) tends to be lowered. If the diameter of the photodetector portion (active layers 26) is greater than 80 μm, then since the photodetector portion is likely to pick up stray light, crosstalk characteristics tend to be impaired.

The submount 30 is mounted together in a structure, in which the optical fiber 15, the PD array 28, and the submount 30 are arranged successively. By contrast, if the submount 30 were mounted in a structure, such that the optical fiber 15, the submount 30, and the PD array 28 are arranged successively, then since the submount 30 is present between the optical fibers 15 and the PD array 28, the length of the optical path of reflected light 24 is increased and the reflected light 24 is greatly dispersed, posing disadvantages with respect to PD efficiency and crosstalk.

With the above structure, in which the optical fiber 15, the PD array 28, and the submount 30 are arranged successively, if the PD array 28 is of a structure for detecting light applied to its face side, then wire bonding is required, for providing electric conduction from the face side to the submount 30. A space of about 100 μm is needed for such wire bonding. This space needs to be filled with the adhesive layer 60, for the purpose of refractive index matching with the optical fibers 15 (quartz), and for improved reliability. Specifically, if the PD array 28 is of a structure for detecting light applied to its face side, an adhesive layer 60 of 100 μm must be present in the optical path, which tends to make characteristics, such as PDL (Polarization Dependency Loss) and wavelength dependency, unstable. Also, because bonding wires are usually made of a metal such as gold, when light is applied to the bonding wires, the light is reflected thereby as stray light, impairing crosstalk.

If the PD array 28 is of a structure for detecting light applied to its reverse side, then the PD array 28 can theoretically be held in contact with the optical fibers 15. However, if the PD array 28 and the optical fibers 15 are held in contact with each other, then physical defects may be liable to occur. Consequently, for safety, a space of about 10 μm may be provided therebetween, which is filled with the adhesive layer 60.

The lengths of the optical paths of the above structures shall be compared with each other. If it is assumed that the active layers 26 are present on the surface of the substrate of the PD array 28 (the surface confronting the optical fibers 15), then since the distance between the surfaces of the optical fibers 15 and the active layers 26 is 100 μm with the structure for detecting light applied to the face side, the length of the optical path is 100/1.45≈69 μm, provided the refractive index of the adhesive layer 60 is 1.45, as with quartz. With the structure for detecting light applied to the reverse side, if the thickness of the adhesive layer 60 is 10 μm and the thickness of the general PD array 28 is 150 μm, then the length of the optical path is 10/1.45+150/3.5≈50 μm. Optically, the length of the optical path is shorter with the structure for detecting light applied to the reverse side, and hence the structure for detecting light applied to the reverse side is preferable from this point of view.

The structure for detecting light applied to the face side and the structure for detecting light applied to the reverse side are significantly different from each other, with respect to the angle at which the light is applied to the active layers 26. With the structure for detecting light applied to the face side, even if the face side has a coating of silicon nitride (having a refractive index of 1.94), the angle at which light is applied to the PD array 28 is about 35°, if the tilt angle α of the slit 18 is 20°. By contrast, with the structure for detecting light applied to the reverse side, the angle at which light is applied to the PD array 28 is 18.5°, which is much smaller than with the structure for detecting light applied to the face side. Thus, the structure for detecting light applied to the reverse side also is preferable from the standpoint of PD efficiency.

Figure 3A:
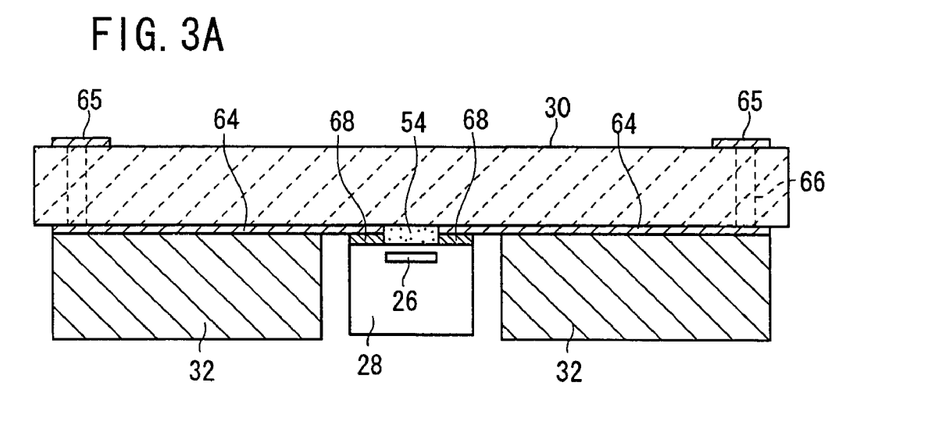
FIG. 3A is a cross-sectional view of the optical head with a spacer fixed to the lower surface of a submount.

Then, the PD array 28 is mounted on the submount 30. As described later (see FIG. 1), the side on the optical fiber array 16 is placed on the package 72, and in order to bring the pins 74 of the package 72 and electrode pads 65 of the submount 30 into an electrically conductive state with the wires 76, a gold electrode pattern 64 is formed on the lower surface (mounting surface 30*a*) of the submount 30, as shown in FIG. 3A. The PD array 28 is mounted in such a manner that the PD array 28 is disposed on the mounting surface 30*a* of the submount 30, wherein the electrode pattern 64 extends to the upper surface of the submount 30 via through holes 66. Thus, the electrode pads 65, depending on the electrode pattern 64 of gold, are formed on the upper surface of the submount 30. The submount 30 is made of Al$_2$O$_3$.

With the PD array 28, which detects light applied to its reverse side, anode electrodes and cathode electrodes are disposed on the active layers 26 (facing the submount 30), and further, a common cathode electrode and the anode electrodes of respective channels are patterned as a gold electrode pattern 64 on the submount 30. Bumps 68 of gold are disposed in regions corresponding to the anode electrodes of the respective channels and the cathode electrode, wherein the region above the active layers 26 is filled with an anisotropic conductive paste 54. The bumps 68 of gold serve the purpose of achieving reliable conduction, and also serve for increasing the inter-electrode distance between the active layer 26 and the submount 30, in order to reduce stray light caused by reflection and scattering in such areas. When heat is applied to the anisotropic conductive paste 54, a conductive material such as silver or the like within the anisotropic conductive paste 54 is attracted to the conductive areas, such as the bumps 68 of gold, thereby providing conductivity only between the anisotropic conductive paste 54 and the electrode pattern 64 of gold.

The area of the lower surface of the submount 30, which corresponds to the active layer 26, is coated with SiN (not shown) for reducing reflection due to differences in the refractive index.

Spacers 32, for determining the gap between the optical fiber array 16 and the PD array 28, are fixed to the mounting surface of the submount 30.

The spacers 32 are made of borosilicate glass, particularly Pyrex (registered trademark) glass material. The gap length is set to 10 μm. Since the thickness of the PD array 28, including the bumps 68 of gold, is 190 μm, the spacers 32 should have a thickness of 200 μm.

The thickness of the spacers 32 should preferably be designed to keep the gap length in a range of from 1 to 100 μm. If the gap length were less than 1 μm, then it would be highly possible for the PD array 28 and the upper surfaces of the optical fibers 15 to come into contact with each other, making it difficult for the adhesive layer 60 to spread entirely into the optical path and tending to trap air inside the optical path. If the gap length were greater than 100 μm, then the light detection efficiency of the PD array would be greatly reduced. The spacers 32, which are designed as described above, are fixed in position by an ultraviolet-curable adhesive.

Figure 3B:
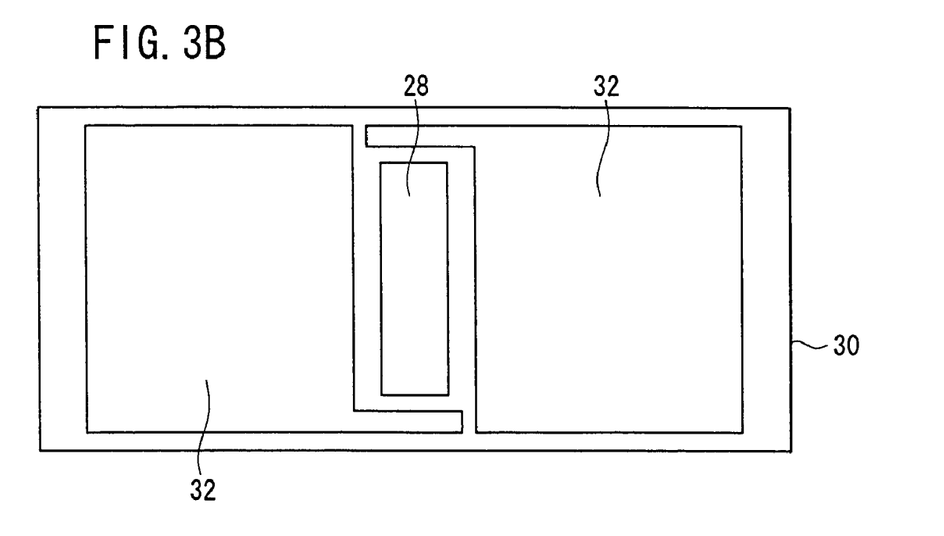
FIG. 3B is a bottom view of the optical head shown in FIG. 3A.

The spacers 32 serve as a base for the submount 30 during the wire bonding process, as well as to determine the gap length. Since the electrodes and the wires 76 are ultrasonically joined to each other during the wire bonding process, if cavities are present directly beneath the electrodes on the submount 30, then ultrasonic energy tends to radiate into such cavities and fails to bond the electrodes and the wires 76 appropriately. Therefore, as shown in FIG. 3B, the spacers 32 are L-shaped, in order to prevent cavities from being created directly below the electrodes.

The optical fiber array 16 is mounted on the submount 30 such that the PD array 28 and the optical fiber array 16 confront each other. Upper portions of the optical fibers 15, serving as the optical path of the reflected light 24, should preferably be coated with a required amount of the adhesive layer 60 (see FIG. 2).

The PD array 28 is aligned by active alignment, in order to maximize the power of the reflected light 24 detected by the PD array 28 (i.e., the power of the reflected light 24 detected by the active layer 26 corresponding to the channels at opposite ends of the optical fiber array 16), when light is applied to the channels at opposite ends of the optical fiber array 16. The power of the reflected light 24 detected by the PD array 28 is monitored by observing an output current from the active layer 26, corresponding to the channels at opposite ends of the optical fiber array 16, with a probe applied to the submount 30.

According to the first embodiment, a wavelength used for alignment is determined for obtaining stricter characteristics. Specifically, if the module is to be used in a C wavelength band (1520-1570 nm), then a central wavelength of 1545 nm is used for alignment. If the module is to be used in an L wavelength band (1570-1610 nm), then a central wavelength of 1590 nm is used for alignment. If the module is to be used in both the C and L wavelength bands, then a wavelength of 1565 nm, at the center of the C and L bands is used for alignment. Therefore, the optical device produces flat characteristics, with respect to the wavelength band in which it is intended to be used.

Then, the PD array 28 is fixed to the optical fiber array 16 by ultraviolet radiation. Specifically, the PD array 28 is positioned on the aligner and is laterally irradiated with ultraviolet rays at 100 mW for 10 minutes. At this stage, although the adhesive layer 60 around the PD array 28 is cured, the adhesive layer 60 is not cured in its entirety. The PD array 28 is then removed from the aligner, and the reverse side of the optical fiber array 16 is irradiated with ultraviolet rays at 10 mW for 5 minutes, whereupon the adhesive layer 60 is cured (secondary curing). A smaller amount, i.e., 10 mW, of ultraviolet rays is applied during the secondary curing process, in order to prevent defects, such as large stress strains and air bubbles, from occurring in the adhesive layer 60 within the optical path of the reflected light 24.

In the optical device 100A according to the first embodiment, the surface of the glass substrate 12 remote from the V-shaped grooves 14 is fixed to the base 75 of the package 72, and the PD array 28 and the pins 74 of the package 72 are electrically connected to each other by conductive patterns formed on the submount 30.

Specifically, the PD array 28 and the pins 74 are electrically connected to each other by the gold electrode pattern 64 on the mounting surface 30a of the submount 30, the through holes 66, the electrode pads 65 on the upper surface of the submount 30, and the wires 76 produced by the wire bonding process. The glass substrate 12 is fixed to the base 75 by die bonding, using a thermosetting adhesive.

The optical head 10 is packaged as follows: First, the ring 78 is fixed in surrounding relation to the optical head 10, and then the optical head 10 is sealed by the resin 80.

The ring 78 serves as a dam when the optical head 10 is sealed by the resin 80. The ring 78 is made of stainless steel. However, the ring 78 may also be made of a molded resin to reduce cost. The ring 78 is fixed in place using a thermosetting adhesive. The sealing resin 80 may comprise a gel material of silicon. The wires 76 are fully covered with the sealing resin 80 by potting, and then the assembly is hardened by applying ultraviolet radiation thereto, to conduct heat curing.

Then, the lid 84 is placed and fixed over the upper opening in the ring 78. The lid 84 comprises a plate of stainless steel. The lid 84 may also be made of a molded resin to reduce cost. The lid 84 may be fixed using a thermosetting resin.

The optical device 100A according to the first embodiment, manufactured according to the above process, was inspected.

The optical device was inspected for various items, including transmission-side characteristics and division-side characteristics. For the transmission-side characteristics, insertion loss, polarization dependency loss, and wavelength dependency, were measured in each channel. As a result, levels causing no problems in use, i.e., an insertion loss of less than 0.8 dB, a polarization dependency loss of less than 0.05 dB, and a wavelength dependency of less than 0.1 dB, were obtained.

For the division-side characteristics, PD efficiency, polarization dependency of the PD efficiency, wavelength dependency, and inter-channel crosstalk in the PD array, were measured in each channel. As a result, levels causing no problems in use, i.e., a PD efficiency in the range of from 50 to 70 mA/W, a polarization dependency of the PD efficiency of less than 0.3 dB, and a wavelength dependency of less than 0.5 dB, were confirmed. Crosstalk was inspected in relation to the total crosstalk of the device. Specifically, while either one of the 4 channels was energized, a sum of currents flowing through the other channels was determined, and the ratio of the current flowing through the input channel and the sum of the currents flowing through the other channels was expressed in terms of 10log. As a result, crosstalk in either one of the channels was −34 dB or lower, confirming that the optical device exhibited excellent characteristics.

The tilt angle α (reflecting angle) of the slit 18, the effect of crosstalk, and PDL are related to each other as trade-offs, such that as the tilt angle α increases, crosstalk is improved but PDL increases, and as the tilt angle α decreases, PDL decreases while crosstalk becomes worse. Through various optimization efforts, satisfactory levels of both PDL and crosstalk were obtained, which could not have been achieved heretofore.

With the optical device 100A according to the first embodiment, when the submount 30 is installed on the glass substrate 12, the PD array 28 can be oriented toward the optical fiber array 16, and can be positioned closely to the cladding surfaces of the optical fibers 15, making it possible to effectively increase the photodetector sensitivity and reduce crosstalk.

Since the PD array 28 can be brought closely to the cladding surfaces of the optical fibers 15, as described above, the optical head 10 itself can be reduced in size, and the optical device 100A including the package 72 can also be reduced in size.

An optical device 100B according to a second embodiment of the present invention shall be described below with reference to FIG. 4.

Figure 4:
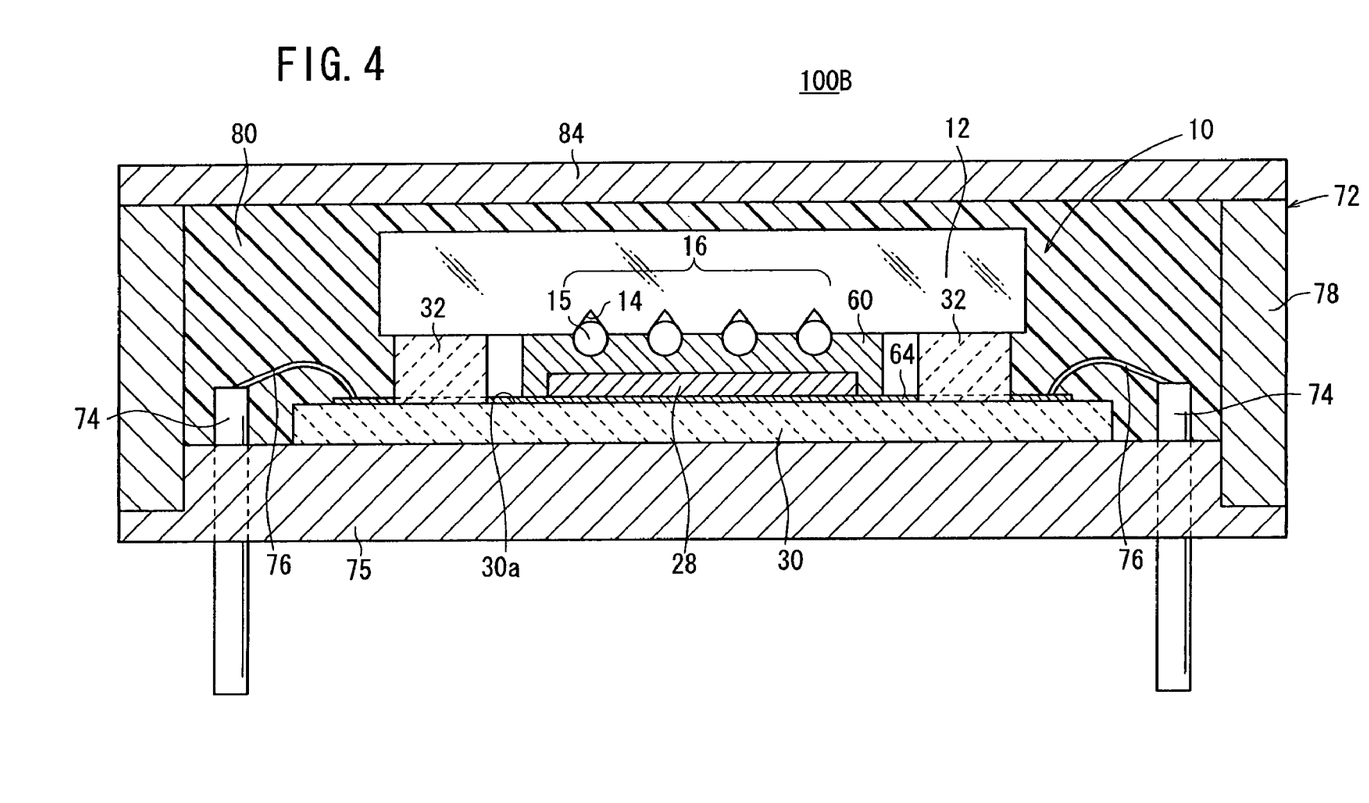
FIG. 4 is a cross-sectional view of an optical device according to a second embodiment of the present invention.

As shown in FIG. 4, the optical device according to the second embodiment is of substantially the same structure as the optical device (see FIG. 1) according to the first embodiment, but differs therefrom in that the surface of the submount 30 remote from the mounting surface 30a is fixed to the base 75 of the package 72, and the PD array 28 and the pins 74 of the package 72 are electrically connected to each other by conductive patterns on the submount 30.

The submount 30 does not have the through holes 66 and the electrode pads 65, and has the gold electrode pattern 64 formed on only the mounting surface 30a. The gold electrode pattern 64 and the pins 74 are electrically connected to each other by the wires 76.

With the optical device 100B according to the second embodiment, since the submount 30 can be installed closely to the pins 74, the length of the wires 76 bonded between the gold electrode pattern 64 and the pins 74 can be reduced. Further, the wire bonding process can be simplified, and the wires 76 provide improved reliability.

An optical device 100C according to a third embodiment of the present invention shall be described below with reference to FIG. 5.

Figure 5:
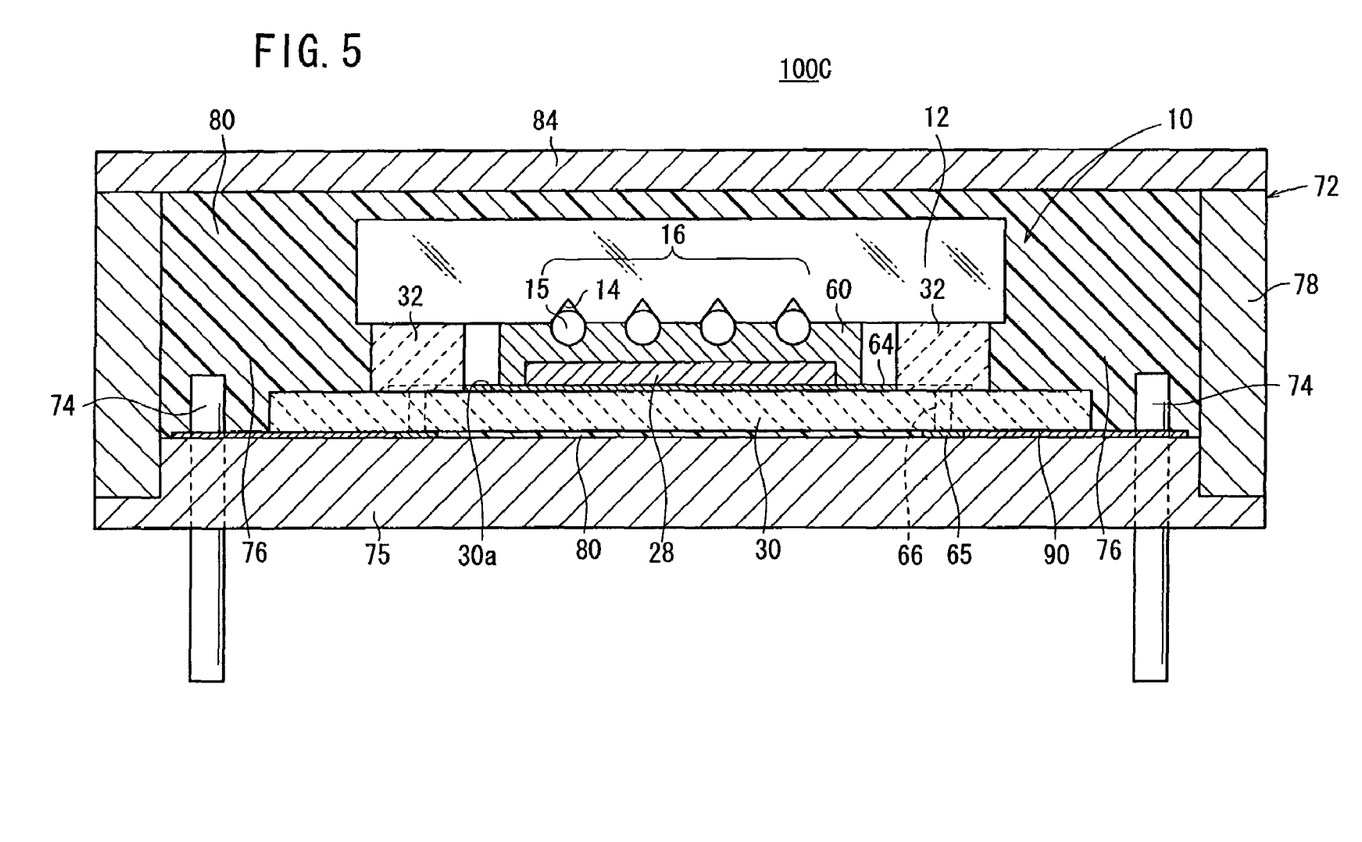
FIG. 5 is a cross-sectional view of an optical device according to a third embodiment of the present invention.

As shown in FIG. 5, the optical device 100C according to the third embodiment is of substantially the same structure as the optical device 100B (see FIG. 4) according to the second embodiment, but differs therefrom in that the submount 30 has the gold electrode pattern 64 formed on the mounting surface 30a, and moreover in that the electrode pads 65 are formed on the surface (fixed to the base 75) of the submount 30 remote from the mounting surface 30a. Further, electrode patterns 90 are formed on the upper surface of the base 75 and extend from positions corresponding to the electrode pads 65 to the pins 74.

Because no wires 76 are required, the wire bonding process can be omitted, and the optical device can be manufactured by a simplified process at reduced cost.

An optical device 100D according to a fourth embodiment of the present invention shall be described below with reference to FIG. 6.

Figure 6:
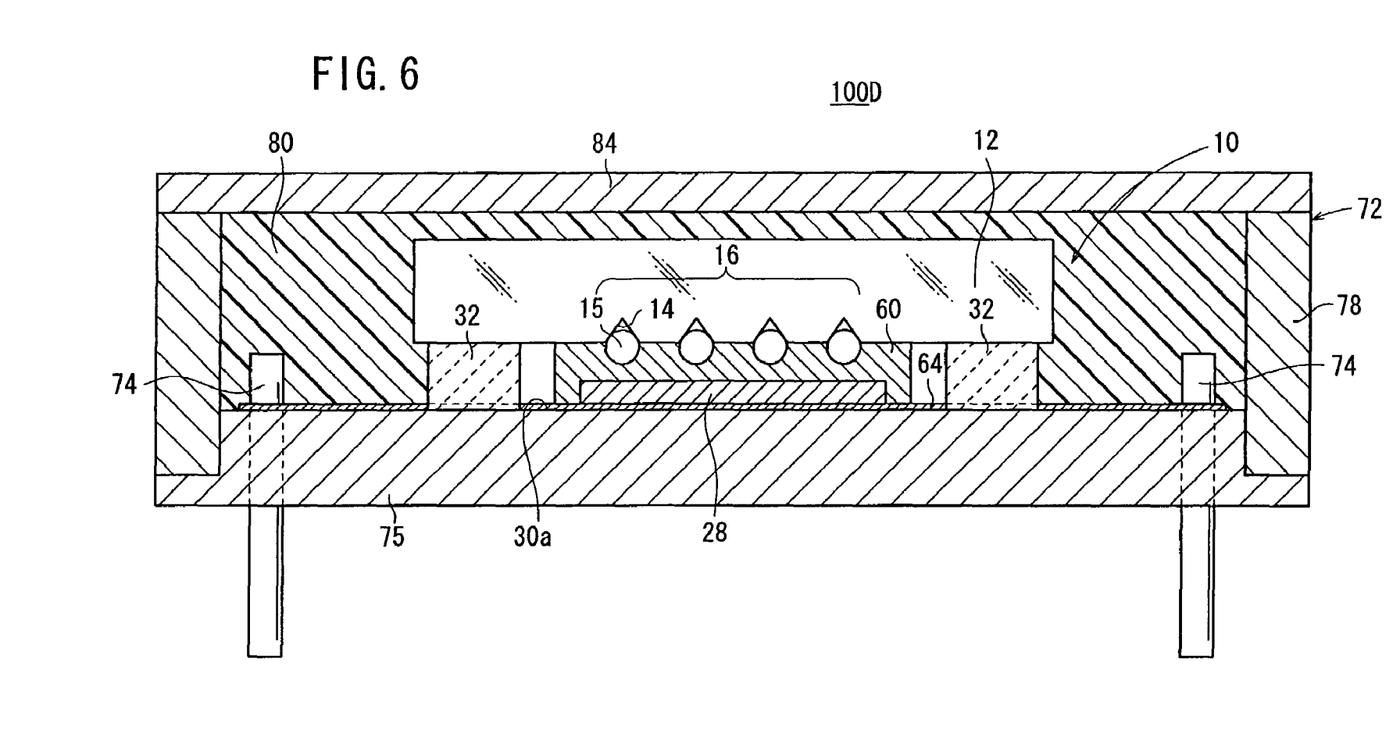
FIG. 6 is a cross-sectional view of an optical device according to a fourth embodiment of the present invention.

As shown in FIG. 6, the optical device 100D according to the fourth embodiment is of substantially the same structure as the optical device 100C (see FIG. 5) according to the third embodiment, but differs therefrom in that the submount 30 of the optical head 10 doubles as the base 75 of the package 72.

Specifically, the PD array 28 and the pins 74 are disposed on the submount 30, and the ring 78 of the package 72 is fixed in place around the submount 30. Therefore, assuming the gold electrode pattern 64 on the mounting surface 30a of the submount 30 extends to the pins 74, then the wire bonding process can be omitted, and the optical device can be manufactured by a simplified process at reduced cost.

Because the submount 30 itself serves as the base 75 of the package 72, the vertical size of the optical device is greatly reduced, making the optical device 100D much smaller.

An optical device 100E according to a fifth embodiment of the present invention shall be described below with reference to FIG. 7.

Figure 7:
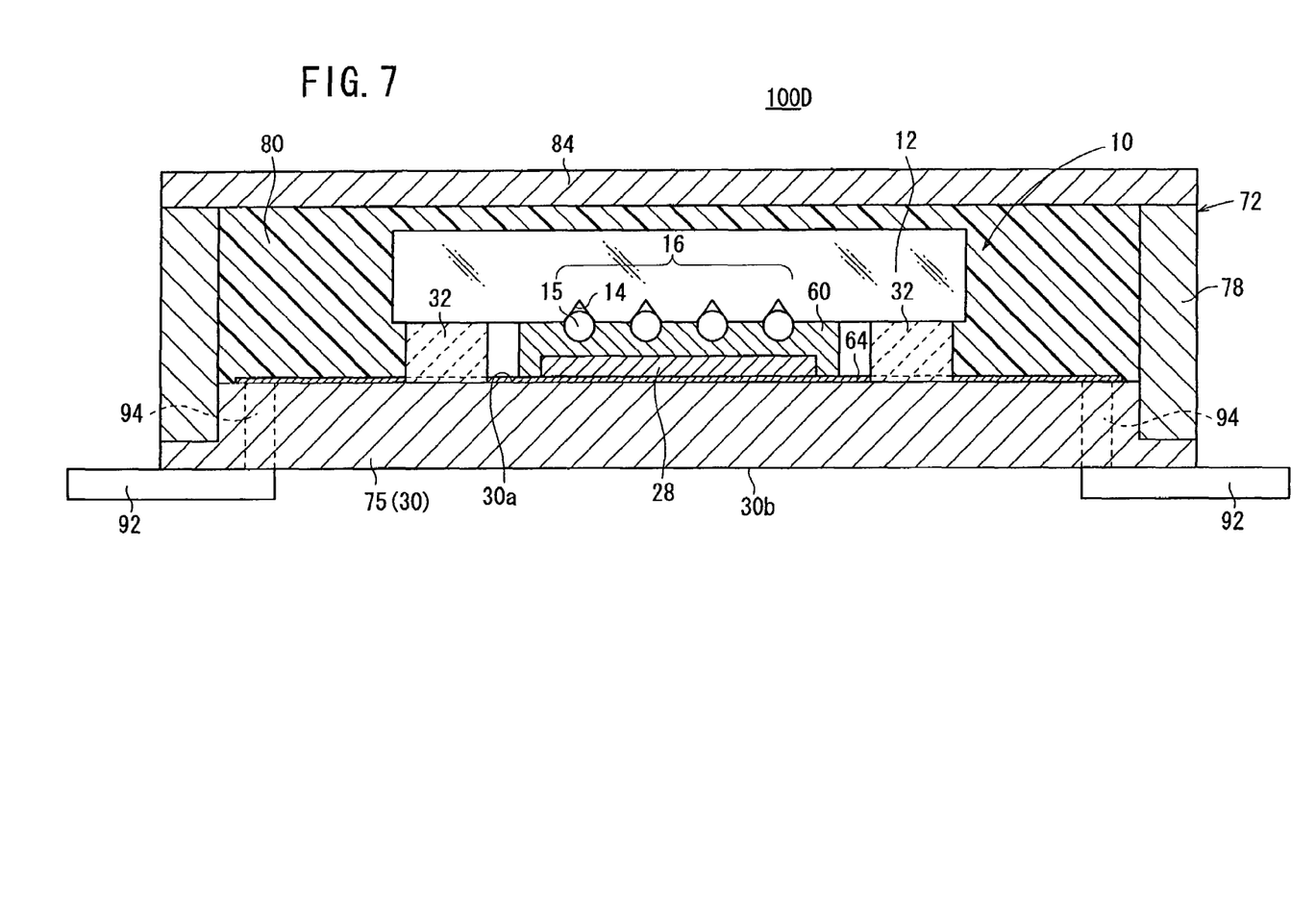
FIG. 7 is a cross-sectional view of an optical device according to a fifth embodiment of the present invention.

As shown in FIG. 7, the optical device 100D according to the fifth embodiment is of substantially the same structure as the optical device 100D (see FIG. 6) according to the fourth embodiment, but differs therefrom in that external leads 92, instead of pins 74, are disposed along an end face 30b of the submount 30, which doubles as the base 75. The submount 30 has via holes 94 therein, and the gold electrode pattern 64 on the mounting surface 30a of the submount 30 is electrically connected to the external leads 92 through the via holes 94.

According to the fifth embodiment, the wire bonding process can be omitted. Furthermore, since the pins 74 do not extend vertically outwardly from the end face 30b of the submount 30 that doubles as the base 75, the overall thickness (height) of the optical device 100E when mounted in place can be reduced, and hence the optical device 100E can be of a smaller size and a lower profile.

The optical device according to the present invention is not limited to the above embodiments, but may have various structures without departing from the scope of the invention as set forth in the appended claims.

What is claimed is:

1. An optical device comprising:
an optical head; and a package housing said optical head therein and having pins extending outwardly;

said optical head comprising:

a first substrate with V-shaped grooves defined therein;

one or more optical fibers fixed in the V-shaped grooves in said first substrate, said optical fibers having a reflecting function;

an optical element fixed by an adhesive layer directly to said one or more optical fibers so as to lie on an optical path of reflected light, which is generated by at least said reflecting function, outside of claddings of said optical fibers; and a second substrate on which said optical element is mounted, wherein said second substrate has a mounting surface on which said optical element is mounted, said mounting surface being disposed in confronting relation to said first substrate;

wherein said optical element and said pins of said package are electrically connected to each other by a conductive pattern disposed on said second substrate, and wherein said reflected light passes from said one or more optical fibers into said optical element without passing through said first substrate.

2. An optical device according to claim 1, wherein said package has a base on which said optical head is mounted; said pins being disposed on said base;

said first substrate having a surface fixed to said base remotely from the surface thereof in which said V-shaped grooves are defined;

said optical element and said pins being electrically connected to each other by the conductive pattern disposed on said second substrate.

3. An optical device according to claim 2, wherein said conductive pattern disposed on said second substrate extends to a surface thereof remote from said mounting surface;

said conductive pattern and said pins being electrically connected to each other by wires.

4. An optical device according to claim 1, wherein said package has a base on which said optical head is mounted; said pin being disposed on said base;

said second substrate having a surface fixed to said base remotely from said mounting surface;

said optical element and said pins being electrically connected to each other by the conductive pattern disposed on said second substrate.

5. An optical device according to claim 4, wherein said conductive pattern is disposed on said mounting surface of said second substrate;

said conductive pattern and said pins being electrically connected to each other by wires.

6. An optical device according to claim 4, wherein said conductive pattern disposed on said second substrate extends to a surface thereof remote from said mount surface;

said conductive pattern and said pins being electrically connected directly to each other.

7. An optical device according to claim 1, wherein said second substrate doubles as a base for said package.

8. An optical device according to claim 7, wherein said pins are disposed on said second substrate;

said conductive pattern being disposed on said mounting surface of said second substrate while being electrically connected directly to said pins.

9. An optical device comprising:

an optical head; and a package housing said optical head therein and having external leads;

said optical head comprising:

a first substrate with V-shaped grooves defined therein;

one or more optical fibers fixed in the V-shaped grooves in said first substrate, said optical fibers having a reflecting function; an optical element fixed by an adhesive layer directly to said one or more optical fibers so as to lie on an optical path of reflected light, which is generated by at least said reflecting function, outside of claddings of said optical fibers; and a second substrate on which said optical element is mounted, wherein said second substrate has a mounting surface on which said optical element is mounted, said mounting surface being disposed in confronting relation to said first substrate and doubling as a base of said package;

wherein said optical element and said external leads of said package are electrically connected to each other by a conductive pattern disposed on said second substrate and via holes defined in said second substrate, and wherein said reflected light passes from said one or more optical fibers into said optical element without passing through said first substrate.

* * * * *